(12) United States Patent  (10) Patent No.: US 8,988,017 B2
Kuisma  (45) Date of Patent: Mar. 24, 2015

(54) RESONATOR

(71) Applicant: Murata Electronics Oy, Vantaa (FI)

(72) Inventor: Heikki Kuisma, Helsinki (FI)

(73) Assignee: Murata Manufacturing Co., Ltd., Kyoto (JP)

( * ) Notice: Subject to any disclaimer, the term of this patent is extended or adjusted under 35 U.S.C. 154(b) by 53 days.

(21) Appl. No.: 13/927,404

(22) Filed: Jun. 26, 2013

(65) Prior Publication Data

US 2014/0001984 A1  Jan. 2, 2014

(30) Foreign Application Priority Data

Jun. 29, 2012  (FI) ..................................... 20125757

(51) Int. Cl.
*H02N 11/00* (2006.01)
*H03B 5/30* (2006.01)

(52) U.S. Cl.
CPC .............. *H02N 11/006* (2013.01); *H03B 5/30* (2013.01)
USPC .............................. 318/116; 318/34; 318/558

(58) Field of Classification Search
CPC ..................................................... H02N 11/00
USPC ........................................... 318/116, 34, 558
See application file for complete search history.

(56) References Cited

U.S. PATENT DOCUMENTS

| 6,301,965 | B1 | 10/2001 | Chu et al. | |
|---|---|---|---|---|
| 6,861,914 | B2* | 3/2005 | Photiadis et al. | 331/156 |
| 2002/0171902 | A1 | 11/2002 | Berhane et al. | |
| 2003/0123046 | A1 | 7/2003 | Heaton | |
| 2005/0104675 | A1 | 5/2005 | Brunson et al. | |
| 2008/0121054 | A1 | 5/2008 | Goldenberg et al. | |
| 2011/0121907 | A1 | 5/2011 | Kanai et al. | |

FOREIGN PATENT DOCUMENTS

WO  WO 03/078302 A2  9/2003

OTHER PUBLICATIONS

Finnish Search Report dated Jun. 4, 2013 corresponding to Finnish Patent Application No. 20125757.
International Search Report dated Oct. 25, 2013 corresponding to International Patent Application No. PCT/FI2013/050696.

* cited by examiner

*Primary Examiner* — David S Luo
(74) *Attorney, Agent, or Firm* — Squire Patton Boggs (US) LLP

(57) ABSTRACT

A mechanical resonator with a closed feed-back damping loop is provided. Displacement in the mechanical resonator is opposed with a damping force determined by the closed feed-back loop that comprises a signal processing filter with associated phase adjustment. An oscillation-free configuration that allows high signal amplification is achieved.

22 Claims, 10 Drawing Sheets

RESONATOR

FIELD OF THE INVENTION

The present invention relates to mechanical resonators and especially to a control element, a mechanical resonator and a method for operating a mechanical resonator.

BACKGROUND OF THE INVENTION

Micro-Electro-Mechanical Systems, or MEMS can be defined as miniaturized mechanical and electro-mechanical systems where at least some elements have a mechanical functionality. Since MEMS devices are created with the same tools that are used to create integrated circuits, micromachines and microelectronics can be fabricated on the same piece of silicon to enable machines with intelligence.

MEMS structures can be applied to quickly and accurately detect very small displacements, for example in inertial sensors. For example, in an accelerometer a mass suspended on a spring structure to the body of the device may be displaced proportional to the acceleration of the device, and these displacements of the mass are detected. As a solid object, the mass-spring structure typically has a resonant frequency in which it exhibits resonance or resonant behavior by naturally oscillating at some frequencies, called its resonant frequencies, with greater amplitude than at others. In these resonant frequencies the displacement is much larger than in other frequencies, which causes overload that disturbs the detection in the miniaturized dimensions of MEMS structures.

These disturbances are typically eliminated by damping of the detected motion. A conventional method has been to use passive gas damping, but for many applications gas damping is too non-linear and causes too many disadvantageous effects to the operation of the system. In some configurations, like vibrating gyroscopes, gas damping is not even applicable, because damping to the resonant excitation of primary vibration must be kept low.

In feed-back damping, or active damping, the detected displacement is monitored and a relative force is generated to oppose the motion. In known systems, active damping has been implemented with a closed feed-back loop that comprises a differentiator and a transducer responsive to the differentiator signal. A differentiator has many properties due to which it is well suited to control damping of displacements in mechanical resonators. The problem is, however, that structures are very seldom ideal, and in real-life resonators there are additional mechanical resonance modes. When the differentiator output signal is amplified to generate an appropriately high damping force, the feed-back-loop easily starts to oscillate disruptively.

BRIEF DESCRIPTION OF THE INVENTION

The object of the present invention is to provide an improved electrical feed-back mechanism for mechanical resonator systems. The objects of the present invention are achieved with a control element, a mechanical resonator and a method according to the characterizing portions of the independent claims.

The preferred embodiments of the invention are disclosed in the dependent claims.

The present invention is based on the idea of including in a damping feed-back loop a signal processing filter. The sign of the feed-back of the closed feed-back loop may be adjusted according to the type of the signal processing filter. Preferably, the response function of the signal processing filter has a resonant frequency characteristic that essentially coincides with the resonant frequency of the damped mechanical resonator. A stable resonator that allows effective amplification of the detected signal is provided. The significant difference in the resonating and non-resonating responses can be used to avoid unwanted oscillations in the closed feed-back loop of the mechanical resonator.

BRIEF DESCRIPTION OF THE FIGURES

In the following the invention will be described in greater detail, in connection with preferred embodiments, with reference to the attached drawings, in which.

DETAILED DESCRIPTION OF SOME EMBODIMENTS

Figure 1:
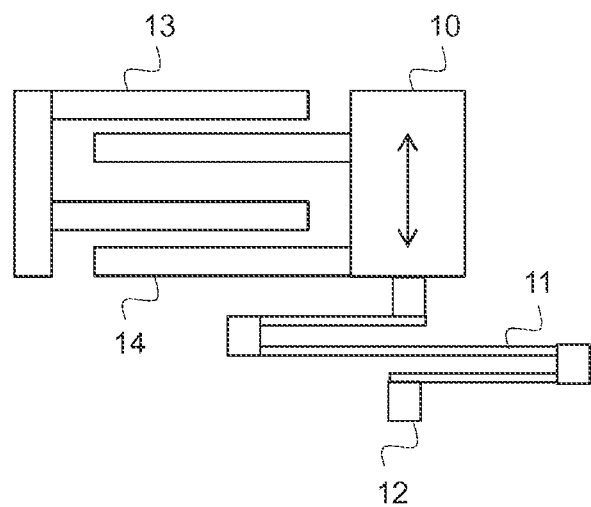
FIG. 1 illustrates a mass-spring system applicable for transducing displacements into electrical signals.

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of control elements, resonator devices and methods comprise elements that are generally known to a person skilled in the art and may not be specifically described herein.

A transducer refers here to a device that converts one form of energy to another. For example, a sensing device or a sensor refers to an apparatus or a system that detects a physical property and converts it into a measurable signal. Typically the physical property manifests itself as one form of energy and is converted in the sensor to another form of energy with a transducer device. The physical property and the means for detecting the form of energy may vary according to the application. In one category of sensors, a characteristic representing a detected physical property may comprise detection of displacement of a reference point with respect of an inertial frame of reference. The displacement may be detected, for example, as movement of a suspended proof-mass, or as stress or strain exerted on a transducer element connected to an elastic suspension that carries the proof-mass. The detected displacement, stress or strain may be used to modulate electrical signals, which makes the physical property quite accurately measurable. As another example, in actuators, transducers may be used to convert electrical energy into some form of motion.

A category of transducer devices applies a mass-spring system where the mass is suspended on the spring to a body in such a manner that a force exerted to the mass or acceleration of the body causes a proportional displacement to the mass. By means of electric circuitry, movement of the mass may be detected and transformed into measurable electrical signals. A mass-spring system is in an equilibrium state when the body is static and no net force acts on the mass. If the system is displaced from the equilibrium, the spring causes a net restoring force on the mass, tending to bring it back to equilibrium. However, in moving back to the equilibrium position, the mass acquires a momentum which keeps it moving beyond that position, establishing a new restoring force in the opposite sense. Hence, the mass begins to oscillate about the equilibrium state. The mass may be biased and its movement in respect of static electrodes then converted to an electrical signal. The harmonic oscillations of the mass thus transform into alternating electrical signals that represent movement of the body with respect to an inertial frame of reference.

FIG. 1 shows a simplified example of a mass-spring system applicable for transducing displacements into electrical signals. The system may have a proofmass 10 and a spring element 11 anchored at anchor point 12 to a sensed object (not shown). The system may have also one or more stationary electrodes 13 anchored to the body and one or more movable electrodes 14 connected to the moving proofmass 10. The transducer for measuring the displacement in FIG. 1 may be based on a capacitive effect, wherein capacitance between electrodes 13 and 14 changes when the distance between them changes. This change in capacitance may be used to modulate an electrical signal output from the transducer.

Figure 2:
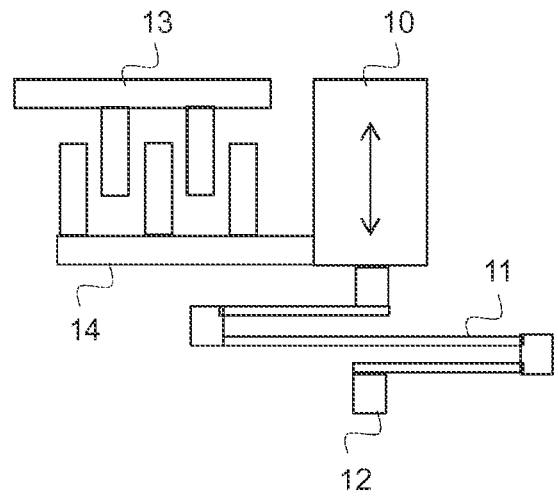
FIG. 2 illustrates another mass-spring system applicable for transducing displacements into electrical signals.

FIG. 2 shows another type of capacitive transducer; same reference numerals are used to refer to corresponding elements in FIGS. 1 and 2. In the transducer of FIG. 2, modulation of the electrical signal corresponds to change in the overlapping areas of the electrodes 13 and 14. The transducers shown in FIGS. 1 and 2 measure displacement of a proof element based on a capacitive effect, but other types of indicators, for example, strain or stress exerted on the proof element, and other types of effects, like piezoelectric, and electromagnetic effect that transform a detected indication of a physical property to an electrical signal may be applied.

Solid objects typically have a natural frequency or group of frequencies at which they tend to oscillate at greater amplitude than at others. A mass-spring system typically resonates and is therefore considered as a resonator. The resonance is a characteristic that may be useful for some applications, but in other applications it may severely disturb the operations. In inertial sensing, the mass-spring system easily overloads when the frequency of the vibration coincides with the resonance frequency of the system. In order to avoid these unwanted side-effects, the resonance of the mass-spring system needs to be damped.

In some devices, gas damping is used to reduce effects of resonance. However, when striving for optimum performance with respect to noise and linearity, gas damping is not the ideal mechanism, since gas damping may have a non-linear relationship to the displacement of the mass. The non-linearity may cause a translation of the vibration to an offset shift, a phenomenon called vibration rectification. It may also introduce a new source of noise due to a specific dissipation mechanism.

Vibrating gyroscopes may also be modeled by mass-spring systems. Any concepts discussed herein for linear resonators can also be applied to torsional resonators, by replacing relevant masses with moments of inertia, displacements with angles, and forces with torques. The resonance effect is even more problematic with vibrating gyroscopes; gas damping cannot be used because damping must be low for resonant excitation of the primary vibration. In gyroscopes the problem has been conventionally solved by increasing the Q-value (quality factor) of the secondary resonator by thousands and dealing with the overload effects by an overload margin.

Figure 3:
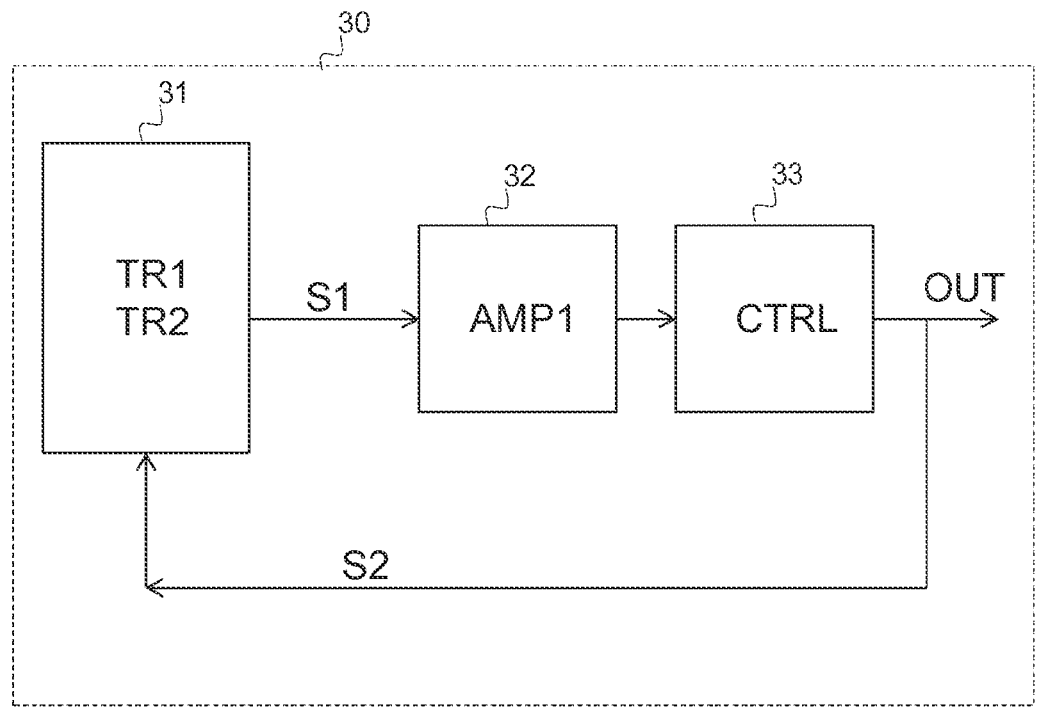
FIG. 3 shows a block diagram of a simplified exemplary sensing device.
Figure 4:
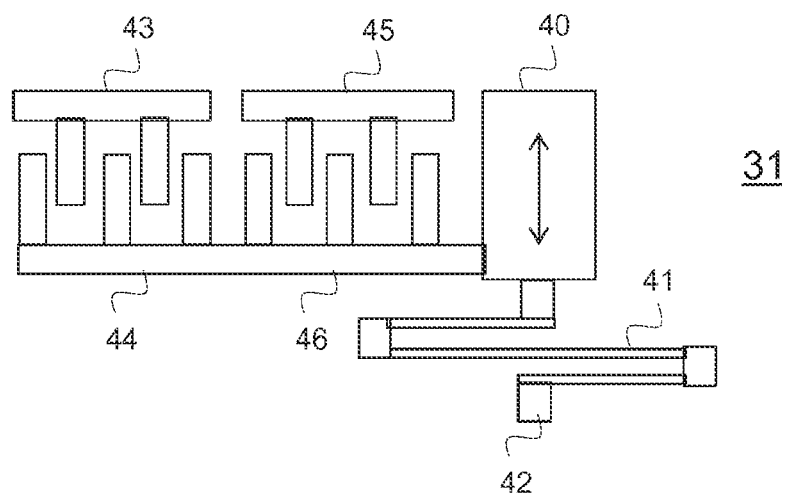
FIG. 4 illustrates configuration of an exemplary mechanical resonator.

Alternatively, a damping method comprising active electrical damping with a feed-back loop can be used. A displacement generates in the first transducer an electrical signal, which is converted in the feed-back loop into a modified signal that controls the mechanical force to be exerted against the displacement to eliminate or at least reduce the detected movement. FIG. 3 shows a block diagram of a simplified exemplary resonator device 30 to illustrate how a feed-back loop of active electrical damping mechanism operates. The device of FIG. 3 comprises a first mechanical resonator 31 that comprises a displacement sensing transducer TR1 and a forcing transducer TR2. FIG. 4 shows a block diagram illustrating a more detailed configuration of the exemplary mechanical resonator 31 of FIG. 3.

The mechanical resonator of FIG. 4 comprises a proofmass 40, and a spring element 41 anchored at an anchor point 42 to a sensed object (not shown). The system has one or more stationary TR1 electrodes 43 anchored to the body and one or more movable TR1 electrodes 44 connected to the motion of the proofmass 40. These electrodes 43, 44 form a capacitive displacement measuring transducer, as will be explained with FIG. 3. The system has also one or more stationary TR2 electrodes 45 anchored to the body and one or more movable TR2 electrodes 46 connected to the motion of the proofmass 40. These electrodes 43, 44 form a force generating electrostatic transducer.

Capacitive and electrostatic transducers in FIG. 4 are only examples. The transducers TR1 and TR2 of FIG. 3 may be based on any transducer principle. For example, the first transducer may be configured to detect displacements by means of motion, stress or strain based on capacitive effect, piezoelectric effect, electromagnetic effect, or piezoresistive effect. The second transducer may be configured to induce displacements by means of force, torque, stress or strain based on electrostatic effect, piezoelectric effect, electromagnetic effect, thermoelastic effect, electrostriction, or magnetostriction.

Returning to FIG. 3, a displacement of a proofmass in the mechanical resonator 31 may be measured electrically with TR1 electrodes (43,44 in FIG. 4) and converted to an electrical signal S1. The first electrical signal S1 may be amplified by an amplifier 32, and the amplified signal fed via a controller 33 to the forcing transducer TR2. TR2 is configured to exert with TR2 electrodes (45,46 in FIG. 4) on the proofmass a mechanical force that corresponds to the second electrical signal S2. S2 is fed to TR2 having such a phase relation to the detected displacement that movement of the proofmass is damped, i.e. reduced by the applied force.

Figure 5:
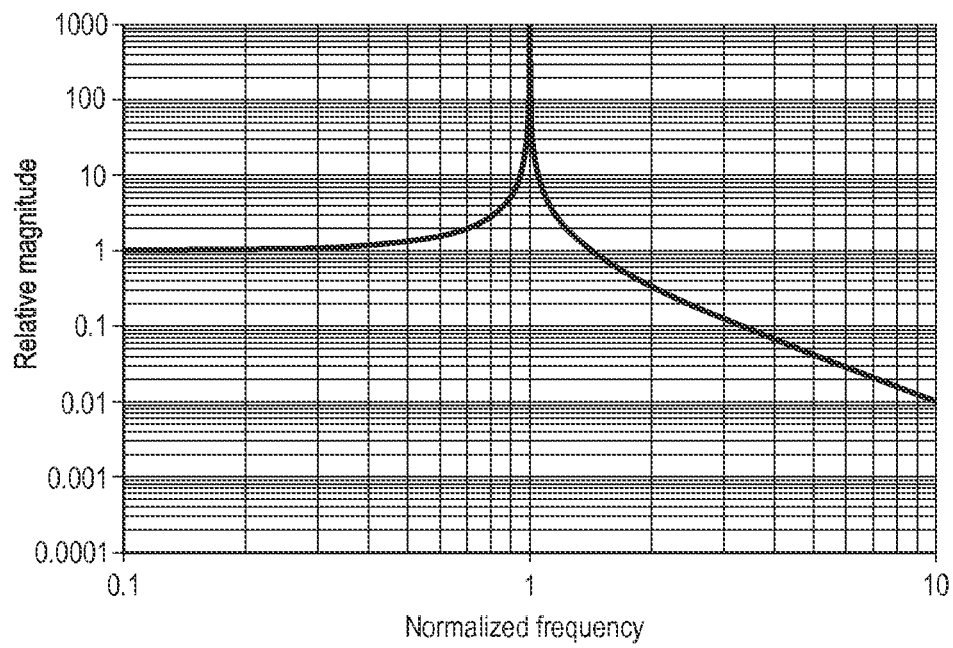
FIG. 5 shows a transfer function of an exemplary mechanical resonator.
Figure 6:
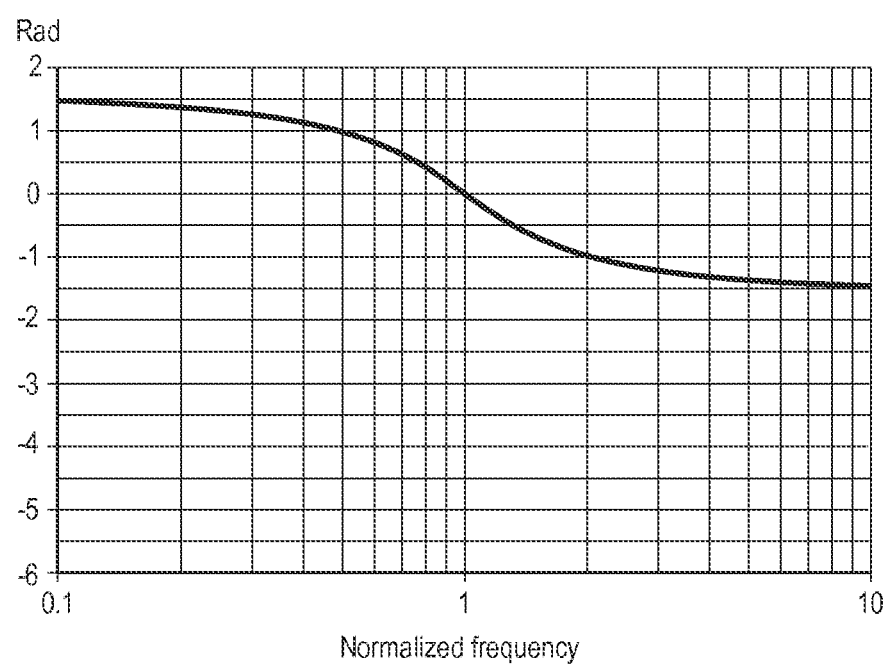
FIG. 6 shows a phase transfer plot of an exemplary mechanical resonator.

The transfer function of the mechanical resonator 31 of FIG. 3 is:

$$H_m(s) = \frac{1}{1 + s/Q_m + s^2} \quad (1)$$

where $Q_m$ is the mechanical Q-value of the mechanical resonator. Frequency has been normalized so that the resonant frequency is represented by $\omega_0 = 2\pi f_0 = 1$, and s represents the normalized frequency (imaginary number). FIG. 5 shows a transfer function of an exemplary mechanical resonator with Q-value 1000, and FIG. 6 shows a phase transfer plot of the same. It is seen that when the mechanical resonator is excited at its resonant frequency, the displacement reached with a specific driving force is maximized. FIGS. 5 and 6 show that there is a very narrow and high peak at the resonant frequency in the amplitude response and a steep transition from 0 to $-\pi$ in the phase response.

Conventionally higher damping can be achieved by increasing the amplification in the feed-back loop, i.e. so called loop gain that includes contributions from any amplifiers in the loop, the controller, the transducers, the frequency response of the mechanical resonator, and the spring constant of the resonator spring element. However, while doing so, one has to make sure that the closed loop transfer function remains stable at all conditions. This may be ensured by selecting a proper transfer function to the controller. A conventional transfer function for this is the differentiator:

$$H_C(s) = s \quad (2)$$

A differentiator is basically an ideal controller since it produces a constant $+\pi/2$ phase shift at all frequencies. This means that in combination with a transfer function of equation (1) good phase margin for closed loop operation may be ensured when negative feed-back is applied. The closed loop transfer functions of (1) and (2) together in the system of FIG. 3 reduces the mechanical Q-value of the system to desired levels, which allows the system to be stable:

$$H(s) = \frac{Ks}{1 + (K + 1/Q_m)s + s^2} \quad (3)$$

where K is the loop gain at low frequency. The effective Q-value of the closed loop is $$Q_{eff} = \frac{1}{K + 1/Q_m} \approx \frac{1}{K} \quad (4)$$

Figure 7:
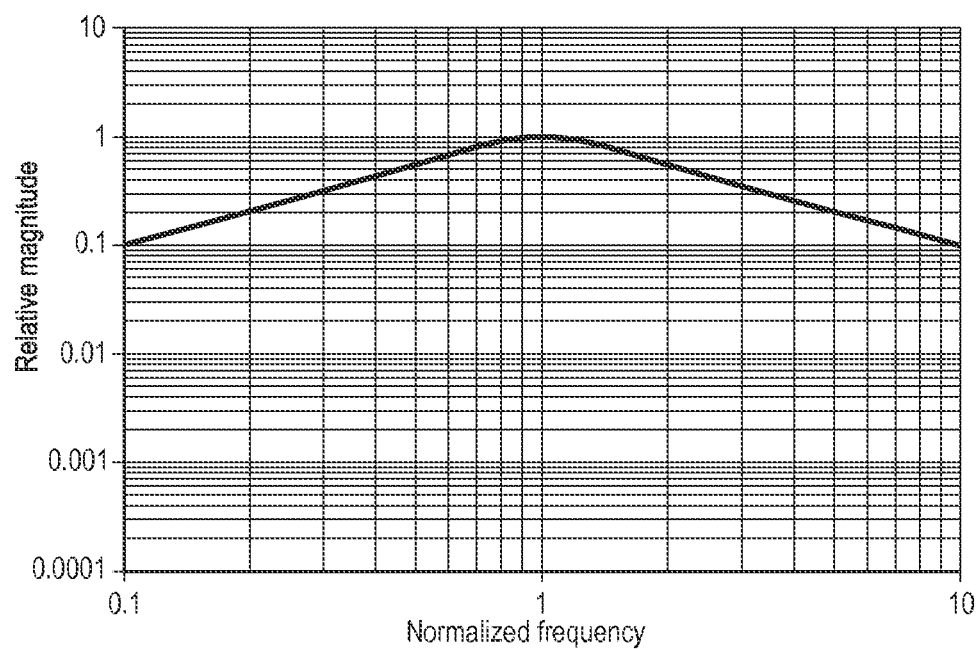
FIG. 7 shows an exemplary conventional closed loop transfer function of a damped mechanical resonator system.
Figure 8:
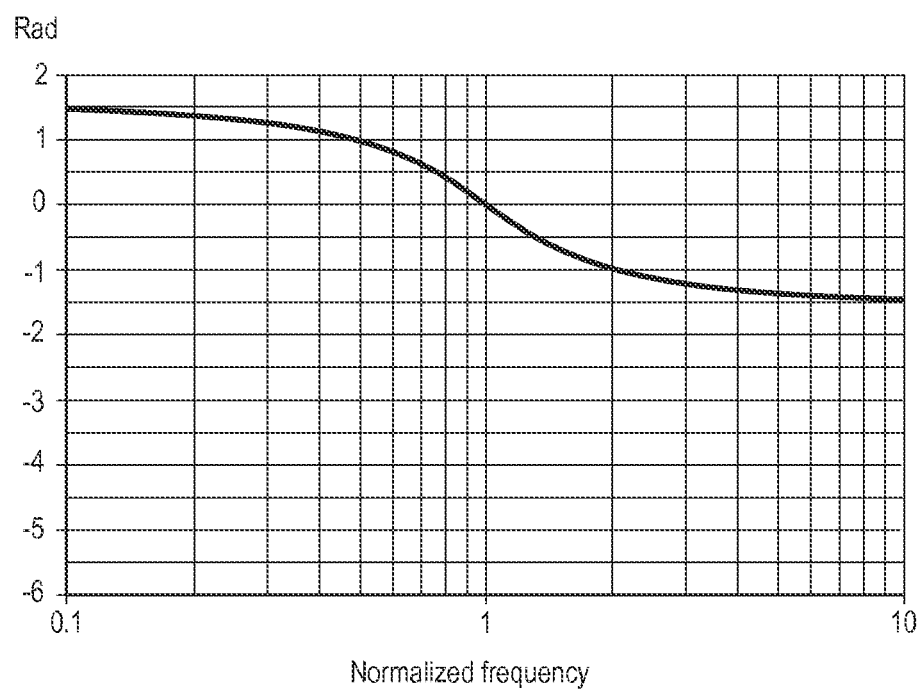
FIG. 8 shows a phase transfer plot of a damped mechanical resonator system.

FIG. 7 shows a closed loop transfer function of the damped mechanical resonator system 30 shown in FIG. 3 in a case where the control element 33 is a differentiator. FIG. 8 shows a phase transfer plot of the same. The mechanical Q-value in FIGS. 7 and 8 has been set to 1000, the low frequency amplification is 1, and the controller CTRL has a transfer function of equation (2).

However, when the controller has a transfer function of equation (2), and when higher values of amplification are attempted, practical systems easily start to oscillate at a frequency that is considerably higher than the resonant frequency of the resonator. This oscillation is caused by additional mechanical resonance modes due to real-life resonators. These modes may be caused e.g. by the flexibility of the mass, by resonances caused by the transducer, deflection in harmonic modes of the springs, deflection in torsion modes of the springs, and similar other non-idealities. Such non-idealities typically cause additional resonance peaks to be created in the transfer function.

Figure 9:
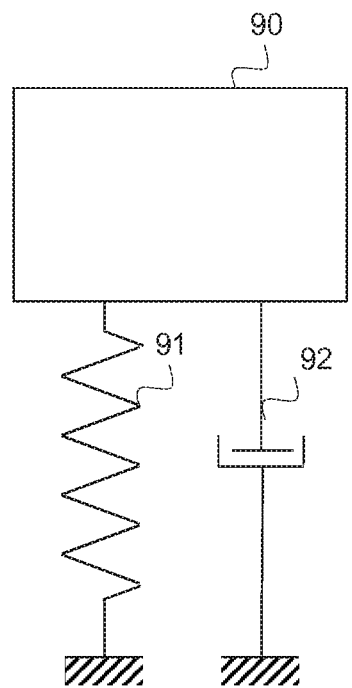
FIG. 9 shows a schematic model of a basic 1-degree-of-freedom mechanical resonator.
Figure 10:
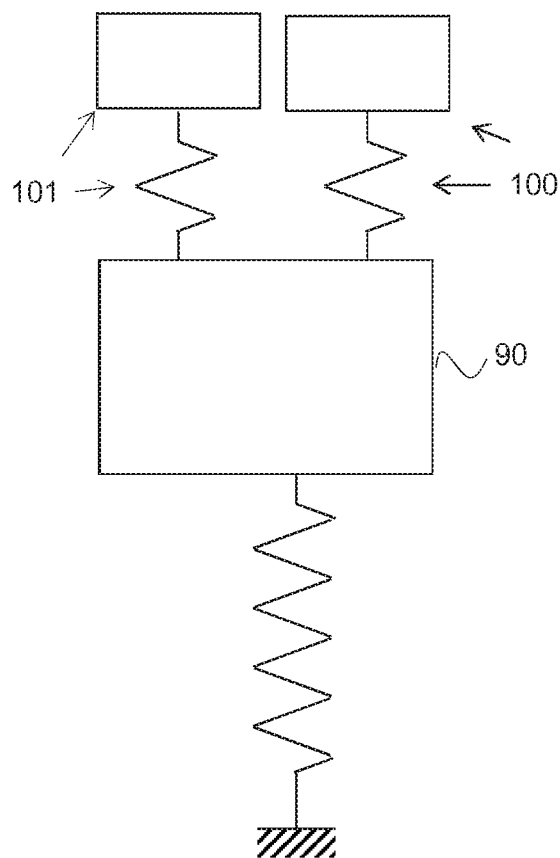
FIG. 10 shows a schematic model a mechanical resonator configuration with additional mass-spring systems.
Figure 11:
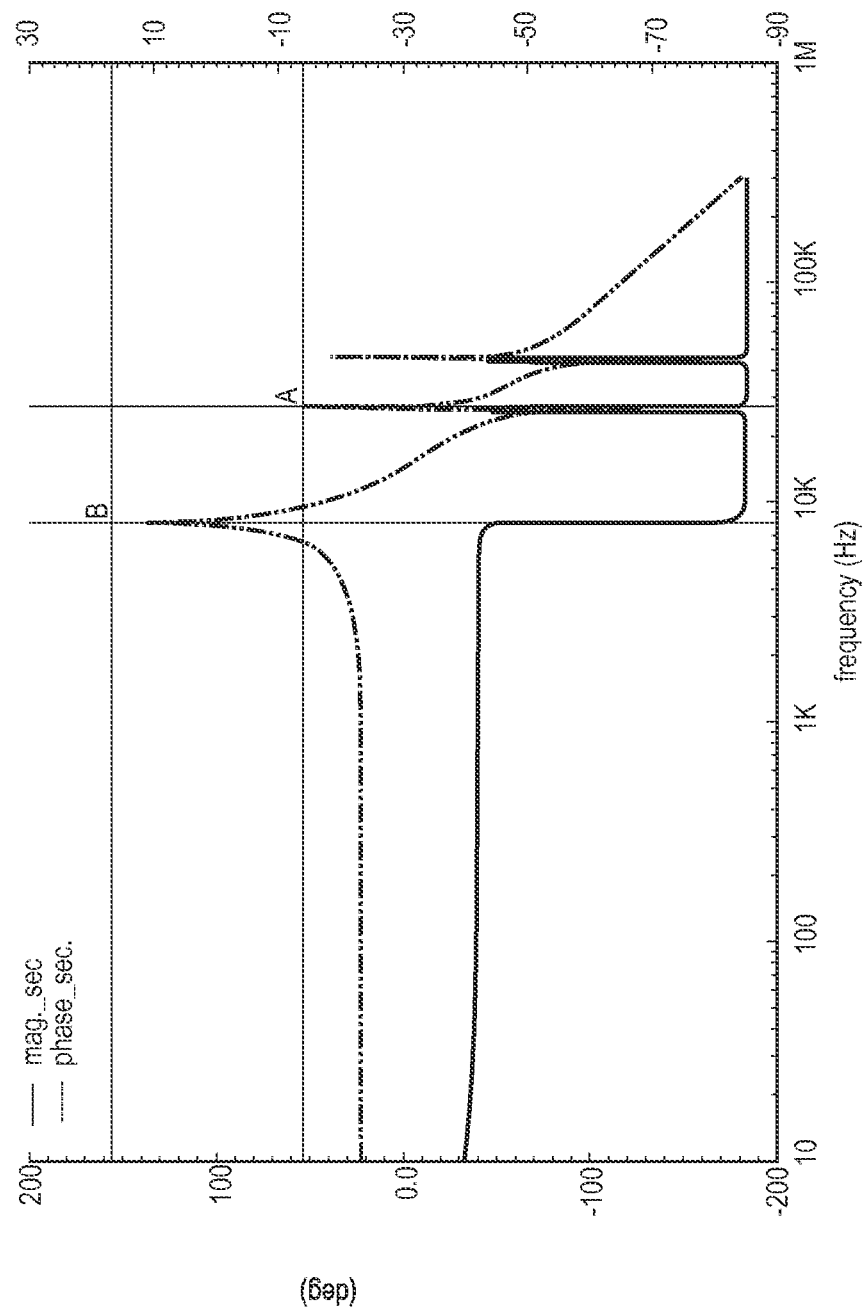
FIG. 11 shows a simulation printout of an exemplary transfer function.

FIG. 9 shows a schematic model of a basic 1-degree-of-freedom mechanical resonator formed of a proofmass 90, a massless spring 91, and a dashpot damper 92. The above mentioned non-idealities can be simulated by including to the configuration additional mass-spring systems 100, 101 as shown in FIG. 10 (for simplicity, the possible mechanical damping is excluded in FIG. 10). FIG. 11 shows an exemplary transfer function received as a result of simulations with a configuration that includes additional masses to represent these real-life non-idealities. FIG. 11 shows typical additional resonant frequencies where oscillation starts when there is enough loop gain and when the phase shift is such that the onset of an oscillation is promoted.

One of the reasons for the observed on-set of oscillations at other resonance modes is that a differentiator typically emphasizes high frequencies. Due to this emphasis, only very moderate levels of amplification have conventionally been possible, and thereby adequate damping is not yet achieved. There has been attempts to compensate for this property of the differentiator by filtering the higher frequencies in the controller (e.g. Toshiki Hirano in Jpn. J. Appl. Phys. Vol. 42 (2003) pp. 1486-1490 Part 1, No. 3, March 2003), but the results are not adequate for many practical applications where the additional resonant frequencies may be close to the main resonant frequency.

Figure 12:
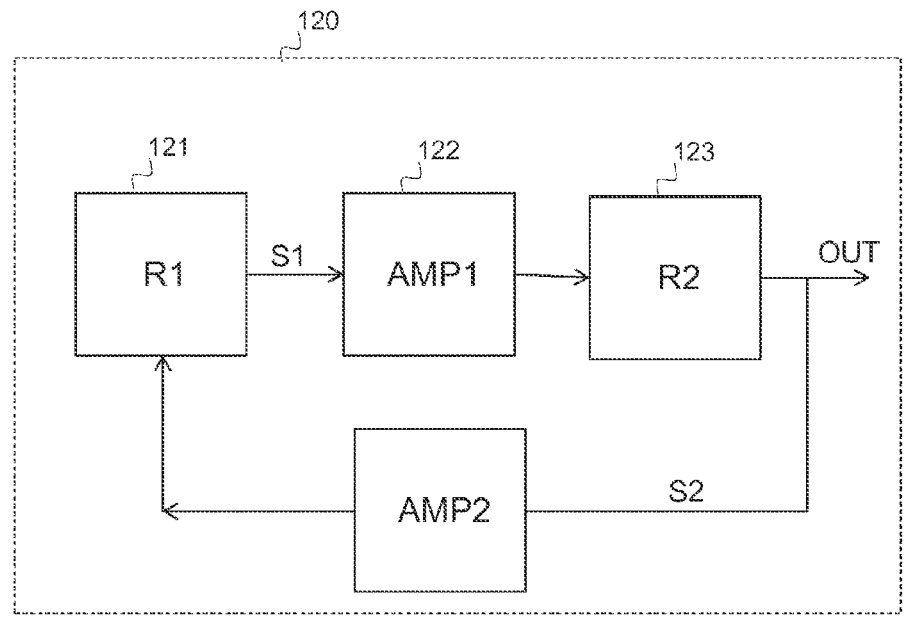
FIG. 12 illustrates a device according to an embodiment of the invention.

FIG. 12 illustrates a device configuration and at the same time steps of a method for controlling operation of a mechanical resonator according to an embodiment of the invention. The configuration is similar to the configuration of FIG. 3, but here feed-back force against the detected motion is controlled with a signal processing filter 123. Advantageously, the signal processing filter 123 functions as a resonator, and therefore peaks at a defined resonant frequency. Accordingly, the response function that defines correspondence between values of S1 and S2 is a frequency response function that has a resonant frequency characteristic that essentially coincides with the resonant frequency of S1.

In signal processing, a filter refers to a device or a process that completely or partially suppresses from a signal some unwanted component or feature. A signal processing filter ("filter") with frequency response is configured to remove from a signal some frequencies and not others. The transfer function of the filter is a frequency response function that defines a relation between a signal that it inputs and a signal that it outputs. A cutoff frequency of the filter is a frequency after which the filter begins to attenuate or eliminate signals. Roll-off of the filter defines steepness of the response function with frequency after the cut-off frequency. It is known that roll-off tends towards a constant gradient at frequencies well away from the cut-off frequency. Roll-off can occur with decreasing frequency as well as increasing frequency, depending on the type of the filter. For example, a low-pass filter will roll-off with increasing frequency, but a high-pass filter will roll-off with decreasing frequency.

Figure 13:
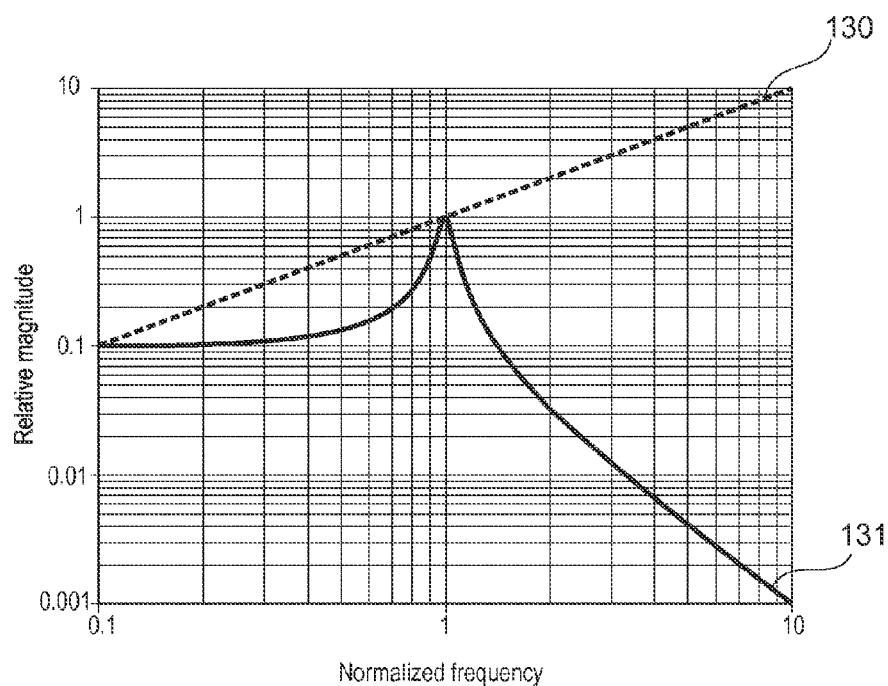
FIG. 13 shows transfer functions for an exemplary differentiator and an exemplary low-pass filter.

In the present embodiment, the signal processing filter is a resonator with a specific resonant frequency just before its cut-off frequency. As shown in FIG. 13 graph 131, this means that the frequency response is high at the resonant frequency of the filter and steeply rolls-off with increasing frequency. In regions in the other side of the cut-off frequency (later: low-frequency response region), the response function is more even, but the difference to the resonance response is still considerable.

It has been discovered that the significant difference in the response of the filter to frequencies in and closely around the resonant frequency and to frequencies beyond them can be applied to avoid unwanted oscillations in the closed feed-back loop of the mechanical resonator. A significantly higher level of damping may be achieved by utilizing this difference. The principle is illustrated in FIG. 13 that shows transfer functions for an exemplary differentiator 130 and for an exemplary low-pass filter 131. It may be seen that in the high frequency range above the resonant frequency, where the additional resonant frequencies typically are, the difference between the responses is considerable, in the order of 100 or more. Accordingly, in this high frequency range the differentiator emphasizes signals, but the resonator very effectively attenuates them. Oscillations caused by additional resonant frequencies in this high frequency range may therefore be effectively eliminated with a resonator.

It is also seen that attenuation of the resonator in the low-frequency response range may not be needed since the main resonance typically the lowest resonant frequency of the device. In order to eliminate adverse effects from unwanted phase shift in that region, amplification of the signal by the resonator has to be controlled. Returning back to FIG. 12, the block chart shows a first resonator R1 121 that, as in FIG. 3, is a mechanical resonator that produces a first electrical signal S1. The frequency of S1 corresponds to vibration of a proof-mass in respect of a frame of reference. S1 may be pre-amplified normally by a first amplifier 122, and the amplified signal fed to a second resonator 123 R2. The second resonator R2 generates, according to its frequency response function, a modified electrical signal S2. S2 may be amplified by the second amplifier and then fed to R1 to define the amount of damping force to be exerted on R1. In some conventional configurations, the primary mechanical system has been stimulated by one or more forcers at the resonant frequency of one of its modes to make it oscillate with constant amplitude. In the present invention, however, resonant frequency response is applied to generate a feed-back damping force that opposes the detected motion.

In order to ensure that the damping occurs at an appropriate phase, the sign of the feed-back may be adjusted according to the type of filter. Let us consider first a case where controller 123 is a low-pass filter. The phase shift of the mechanical resonator at the resonant frequency is $-\pi/2$ and the phase shift of the low-pass filter is $-\pi/2$. For stable operation, the phase shift of the feed-back loop may be $-\pi$. This means that in the case of a low-pass filter, the sign of the feed-back may be positive at low frequencies. The sign of the feed-back-loop may be reversed with mechanisms well known to a person skilled in the art, for example with amplification stages, or appropriate adjustment of other loop parameters such that the signals are summed instead of subtracted. In the roll-off region, the fast decrease in response levels ensures oscillation-free operation. It is, however, well known that positive feed-back may cause instability in the low-frequency response region, which in certain embodiments of the invention would entail the low-pass filter in the low frequency range.

Consequently, in order to avoid instability by signals in the low frequency range, their amplification may be set to a low level, preferably to values less than 1. By selecting the electrical Q-value of the low-pass filter from a range of 3 to 10, and arranging the amplitude peak of the low-pass filter to essentially coincide with the resonant frequency of the mechanical resonator R1, the amplification of R2 at low frequency can be reduced well below 1, and still the loop gain around the resonant frequency can be increased with AMP2 to a high enough level for efficient damping.

Figure 14:
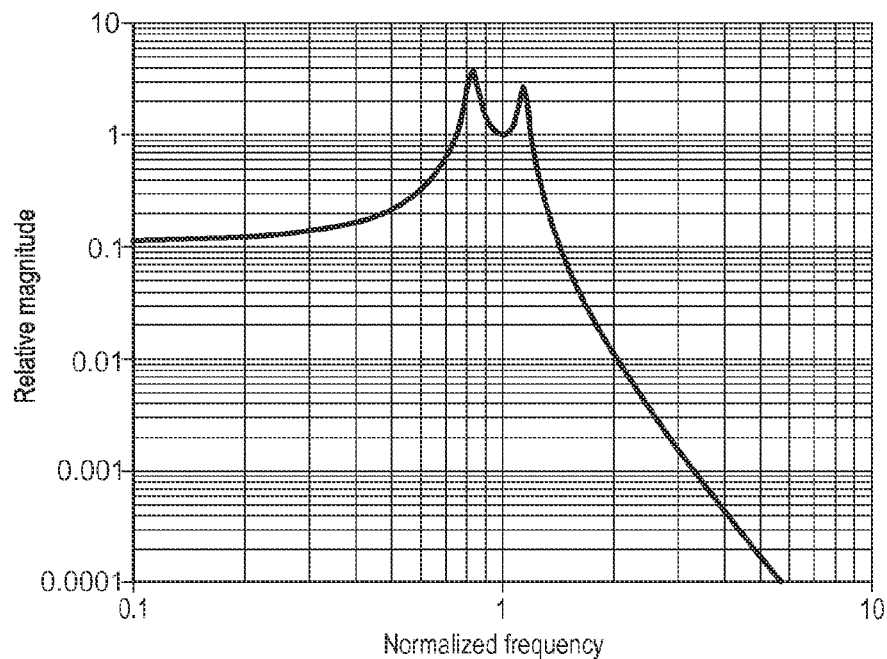
FIG. 14 shows amplitude response function for a closed loop with a low-pass filter.
Figure 15:
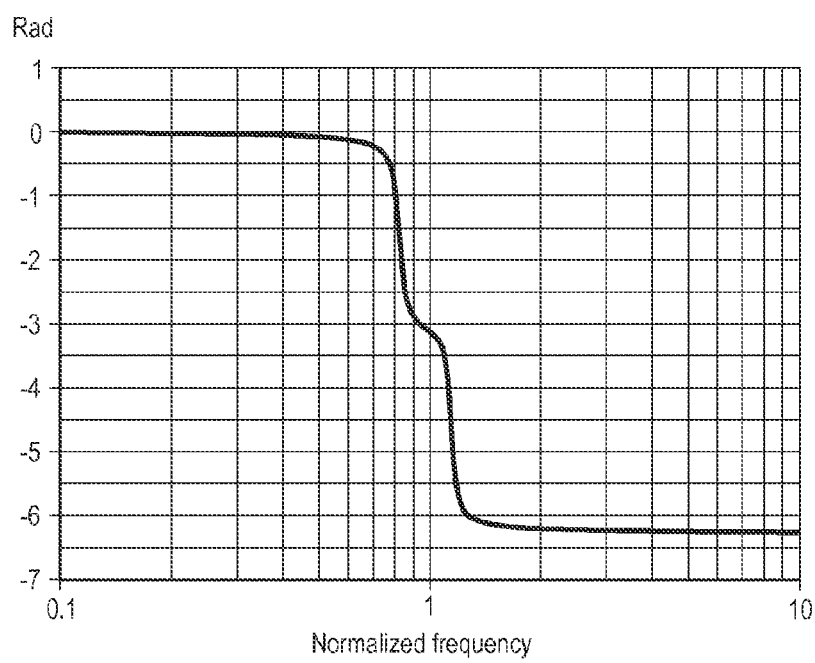
FIG. 15 shows a phase response function for a closed loop with a low-pass filter.

An advantageous low-pass transfer function for the controller may have the form:

$$H_{LP}(s) = \frac{K}{1 + s/Q_e + s^2} \tag{5}$$

where $Q_e$ is the Q-value of the low-pass filter and K is the amplification at low frequency. $Q_e$ is preferably in the range from 3 to 10 and K is in the range from 0.1 to 0.3. When the transfer function of the equation (5) is used in a feed-back system and the sign of the feed-back is selected as positive, one obtains a closed loop transfer function as shown in FIG. 14 for the amplitude and in FIG. 15 for the phase.

It may be seen that the amplitude response has two peaks around the resonant frequency of the mechanical resonator, but they are not so high as to compromise the damping of the original very high Q-value resonance. As a further advantage, the matching of the peak of the controller response to the mechanical resonance does not have to be very precise. A 10% deviation does not cause a noticeable effect, and a deviation as high as 30% may still be useful. Essential coincidence may in this context be interpreted to mean that the resonant frequency in which the transfer function of the second resonator (controller R2) reaches its highest value may deviate to some extent from the resonant frequency of the mechanical resonator R1. Advantageously, the deviation remains under 20% such that the resonant frequency of R2 remains in the range of 80% to 120% of the resonant frequency of R1. However, even a 50% deviations, i.e. R2 values in the range of 50% to 150% of the resonant frequency of R1 are applicable for some applications of damping.

Due to the tendency of the additional resonant frequencies to appear in higher frequencies, the low-pass filter operates very well in the feed-back loop because the fast roll-off efficiently eliminates the unwanted elements from the signal. By adjusting the amplification of the controller low enough, it is also possible to eliminate the instability in the low frequency range. As such, a damping signal that provides the correct phase shift and can be strongly amplified is achieved.

The same concept may be applied to other types of filters, as well. In another embodiment, controller 33 may be implemented with a high-pass filter. In this case, the phase shift in the feed-back loop from the mechanical resonator is $-\pi/2$, and the phase shift of the high-pass filter is $+\pi/2$. This means that in the case of a high-pass filter, other aspects of the closed loop may be designed in the similar manner as in the low-pass filter case, but the sign of the feed-back may now be set to be negative. A transfer function for the high-pass configuration may have the form:

$$H_{HP}(s) = \frac{Ks^2}{1 + s/Q_e + s^2} \tag{6}$$

Figure 16:
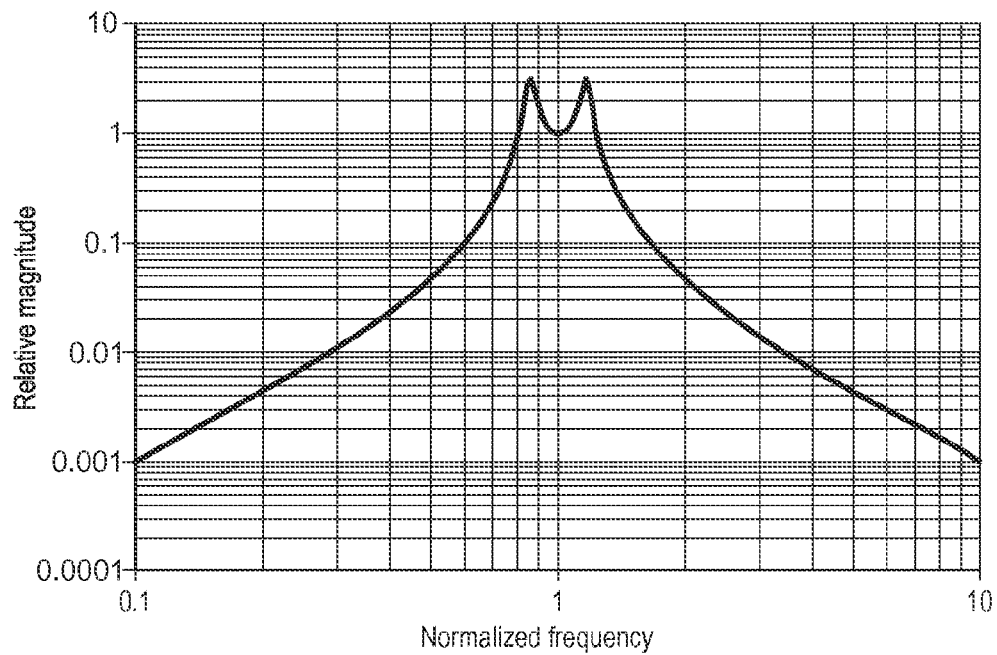
FIG. 16 shows amplitude response function for a closed loop with a high-pass filter.
Figure 17:
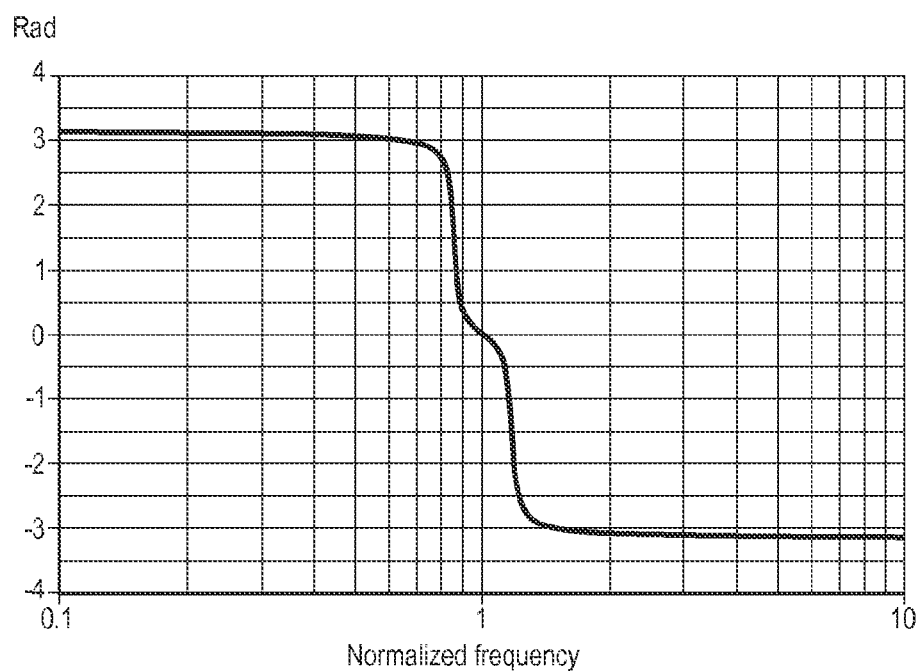
FIG. 17 shows a phase response function for a closed loop with a high-pass filter.

With negative feed-back the resulting amplitude and phase transfer functions become as shown in FIGS. 16 and 17 respectively.

In another embodiment, controller 33 may be implemented with a combination of a band-pass filter and an all-pass filter.

In this case, the phase shift in the feed-back loop from the mechanical resonator is $-\pi/2$, and the phase shift of the band-pass filter is 0. The band-pass filter provides appropriate frequency response characteristics, but appropriate phase shift values cannot be provided. The phase shift of an all-pass filter is $-\pi/2$ with no effect on roll-off, so with an added all-pass filter, the desired frequency response characteristics can be maintained, and the correct phase shift provided when the sign of the feed-back is set positive. Other aspects of the closed loop may be designed in a similar manner to the low-pass filter. A transfer function for the band-pass/all-pass configuration may have form $$H_{BP-AP}(s) = \frac{Ks}{1+s/Q_e+s^2} \cdot \frac{1-s}{1+s} \quad (7)$$

Figure 18:
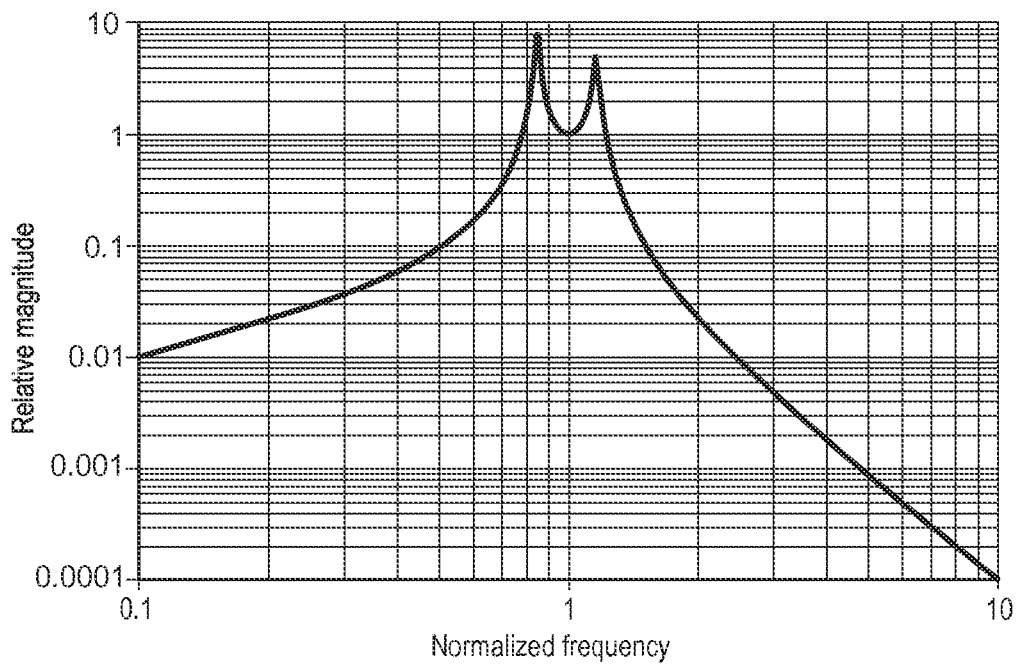
FIG. 18 shows amplitude response function for a closed loop with a combination of a band-pass filter and an all-pass filter.
Figure 19:
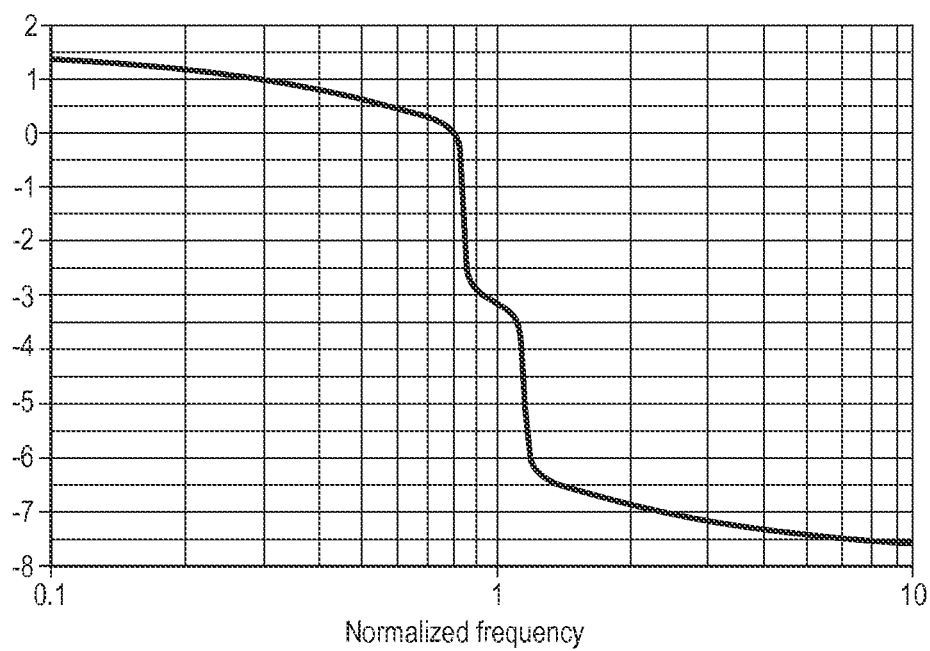
FIG. 19 shows a phase response function for a closed loop with a combination of a band-pass filter and an all-pass filter.

When positive feed-back is applied the resulting amplitude and phase transfer functions are as shown in FIGS. 18 and 19 respectively.

In a further embodiment, controller 33 may be implemented with an all-pass filter that has the resonating or even a flat frequency characteristics. The results are still superior to controlling the resonator with a differentiator. In this case, the phase shift in the feed-back loop from the mechanical resonator is $-\pi/2$, and the phase shift of the all-pass filter is $-\pi/2$. Appropriate phase shift can thus be achieved by setting the sign of the feed-back positive. Other aspects of the closed loop may be designed in the similar manner as in the low-pass filter case.

It is apparent to a person skilled in the art that as technology advances, the basic idea of the invention can be implemented in various ways. The resonator device may be a sensor device, like an accelerometer, an angular rate sensor, a magnetic field sensor, an actuator device, like an opto-mechanical device, or a switching device. Furthermore, for simplicity, only lowest order filters with suitable frequency responses have been discussed herein. Higher order filters with appropriate resonance and phase characteristics are well within the scope of this invention. The invention and its embodiments are therefore not restricted to the above examples, but may vary within the scope of the claims.

The invention claimed is:

1. A control element, comprising:
an input for a first electrical signal that corresponds to a displacement of reference point in a mechanical resonator in response to forces acting upon the mass;
an output for a second electrical signal that defines a damping feed-back force to be acted upon the mechanical resonator; and
a signal processing filter for generating a second electrical signal according to a specific response function, the response function defining correspondence between values of the first electrical signal and the second electrical signal.

2. A control element according to claim 1, wherein the first electrical signal has a first resonant frequency, and the response function is a frequency response function that has a resonant frequency characteristic that essentially coincides with the first resonant frequency.

3. A control element according to claim 2, wherein the quality factor of the signal processing filter is above 1.

4. A control element according to claim 3, wherein the quality factor of the signal processing filter is in the range 3 to 10.

5. A resonator device comprising:
a mechanical resonator;
a closed feed-back loop including a first transducer, a second transducer and a control element;
the first transducer is configured to output a first electrical signal that corresponds to displacement of a reference point in the mechanical resonator with respect to an inertial frame of reference, the first electrical signal having a first resonant frequency;
the control element is electrically coupled to the first transducer and the second transducer;
the control element is configured to receive from the first transducer the first electrical signal and generate a second electrical signal according to a specific response function, the response function defining correspondence between values of the first electrical signal and the second electrical signal;
the control element is configured to feed the second electrical signal to the second transducer;
the second transducer is configured to exert to the mechanical resonator a damping force that corresponds to the second electrical signal; and
the control element is a signal processing filter.

6. A resonator device according to claim 5, wherein the response function of the signal processing filter has a resonant frequency characteristic that essentially coincides with the first resonant frequency.

7. A resonator device according to claim 6, wherein the quality factor of the signal processing filter is more than 1.

8. A resonator device according to claim 7, wherein the quality factor of the signal processing filter is in the range 3 to 10.

9. A resonator device according to claim 5, wherein the loop gain of the closed feed-back loop for frequencies below the first resonant frequency is less than 1.

10. A resonator device according to claim 9, wherein the loop gain of the closed feed-back loop for frequencies below the first resonant frequency is in the range 0.1 to 0.3.

11. A resonator device according to claim 5, wherein deviation of the resonant frequency characteristic from the first resonant frequency is less than 50%.

12. A resonator device according to claim 11, wherein deviation of the resonant frequency characteristic from the first resonant frequency is less than 20%.

13. A resonator device according to claim 5, wherein the control element is a low-pass filter and the feed-back of the closed feed-back loop is positive.

14. A resonator device according to claim 5, wherein the control element is a high-pass filter and the feed-back of the closed feed-back loop is negative.

15. A resonator device according to claim 5, wherein the control element is a combination of a band-pass filter and an all-pass filter and the feed-back of the closed feed-back loop is positive.

16. A resonator device according to claim 5, wherein the control element is an all-pass filter and the feed-back of the closed feed-back loop is positive.

17. A resonator device according to claim 5, wherein the sensing device is a MEMS device.

18. A method according to claim 17, wherein the response function of the signal processing filter has a resonant frequency characteristic that essentially coincides with the first resonant frequency.

19. A resonator device according to claim 5, wherein the first transducer is configured to detect displacement by means of motion, stress or strain based on capacitive effect, piezo-electric effect, electromagnetic effect or piezoresistive effect.

20. A resonator device according to claim 5, wherein the second transducer is configured to induce displacement by means of force, torque, stress or strain based on electrostatic effect, piezoelectric effect, electromagnetic effect, thermelastic effect, electrostriction or magnetostriction.

21. A resonator device according to claim 5, wherein the resonator device is a sensor device or an actuator device.

22. A method for controlling operation of a mechanical resonator, comprising:
- coupling the mechanical resonator to a closed feed-back loop including a first transducer, a second transducer and a control element;
- outputting from the first transducer to the control element a first electrical signal that corresponds to displacement of a reference point in the mechanical resonator with respect to an inertial frame of reference, the first electrical signal having a first resonant frequency;
- generating in the control element a second electrical signal according to a specific response function, the response function defining correspondence between values of the first electrical signal and the second electrical signal, the control element being a signal processing filter;
- feeding the second electrical signal from the control element to the second transducer; and
- exerting with the second transducer to the mechanical resonator a damping force that corresponds to the second electrical signal and opposes the displacement.

* * * * *